(12) United States Patent
Huang et al.

(10) Patent No.: US 12,451,817 B2
(45) Date of Patent: Oct. 21, 2025

(54) POWER MODULE

(71) Applicant: SENTEC E&E CO., LTD., Taoyuan (TW)

(72) Inventors: Jason An Cheng Huang, Taoyuan (TW); Liang-Yo Chen, Taoyuan (TW); Kun-Tzu Chen, Taoyuan (TW); Nai-Hsi Hu, Taoyuan (TW)

(73) Assignee: SENTEC E&E CO., LTD., Taoyuan (TW)

( * ) Notice: Subject to any disclaimer, the term of this patent is extended or adjusted under 35 U.S.C. 154(b) by 451 days.

(21) Appl. No.: 18/129,320

(22) Filed: Mar. 31, 2023

(65) Prior Publication Data
US 2023/0396187 A1 Dec. 7, 2023

(30) Foreign Application Priority Data

Jun. 2, 2022 (TW) .................................. 111120757
Feb. 16, 2023 (TW) .................................. 112105648

(51) Int. Cl.
*H02M 7/58* (2006.01)
*H02M 7/5387* (2007.01)
*H05K 7/14* (2006.01)
*H02M 7/00* (2006.01)

(52) U.S. Cl.
CPC .... *H02M 7/53871* (2013.01); *H05K 7/14322* (2022.08); *H02M 7/003* (2013.01)

(58) Field of Classification Search
None
See application file for complete search history.

(56) References Cited

U.S. PATENT DOCUMENTS

| | | | |
|---|---|---|---|
| 11,574,859 B2* | 2/2023 | Cole | H01L 25/072 |
| 11,652,473 B2* | 5/2023 | Curbow | H03K 17/165 |
| | | | 327/109 |
| 2010/0025126 A1* | 2/2010 | Nakatsu | H05K 7/02 |
| | | | 361/699 |
| 2014/0218871 A1* | 8/2014 | Kim | H01L 12/7088 |
| | | | 361/748 |
| 2014/0376184 A1* | 12/2014 | Gohara | H05K 7/20254 |
| | | | 361/689 |
| 2015/0029666 A1* | 1/2015 | Kosuga | H02M 7/003 |
| | | | 361/699 |

(Continued)

*Primary Examiner* — Krystal Robinson
(74) *Attorney, Agent, or Firm* — Birch, Stewart, Kolasch & Birch, LLP

(57) ABSTRACT

A power module includes two power input terminals, two main substrates, a plurality of first switches, a plurality of second switches, and a bridge main unit. The bridge main unit is across the two main substrates, and includes a first bridge subunit and a second bridge subunit. Each of the first bridge subunit and the second bridge subunit includes a first conducting region on a bottom surface, and a second conducting region and a third conducting region on a top surface. The first conducting region transmits a current signal of a current path of a switch circuit formed by the power input terminals, the first switches, and the second switches. The second conducting region is connected to the control terminals of the first switches and the second switches. The third conducting region is connected to the output terminals of the first switches and the second switches.

20 Claims, 13 Drawing Sheets

(56) References Cited

U.S. PATENT DOCUMENTS

| | | | |
|---|---|---|---|
| 2023/0225044 A1* | 7/2023 | Jeon | H01L 25/072 361/783 |
| 2023/0232589 A1* | 7/2023 | Sugahara | H05K 7/20154 361/697 |
| 2023/0291321 A1* | 9/2023 | Liu | H02M 7/003 |
| 2024/0022180 A1* | 1/2024 | Ewald | H05K 1/181 |

* cited by examiner

POWER MODULE

CROSS-REFERENCES TO RELATED APPLICATIONS

This non-provisional application claims priority under 35 U.S.C. § 119(a) to Patent Application No. 111120757 filed in Taiwan, R.O.C. on Jun. 2, 2022 and Patent Application No. 112105648 filed in Taiwan, R.O.C. on Feb. 16, 2023, the entire contents of which are hereby incorporated by reference.

BACKGROUND

Technical Field

The present disclosure relates to a power conversion technology, and in particular to a power module.

Related Art

As environmental awareness raises, an apparatus taking renewable energy as a power source gradually emerges, for example, an electric vehicle and the like. A motor of the electric vehicle has a power module for power management. The power module has two main substrates secured to a shell. One of the two main substrates has a part of an upper-arm circuit and a part of a lower-arm circuit in a switch circuit, while the other main substrate has the other part of the upper-arm circuit and the other part of the lower-arm circuit in the switch circuit. The two main substrates are electrically connected through a wire (for example, electrically connected in a wire bonding manner), thereby forming the switch circuit. Compared with the shell, the main substrate has a lower thermal expansion coefficient. As a result, implementing the switch circuit by using only one main substrate may damage the main substrate under impact of a thermal stress.

As a technology progresses, a current for the motor of the electric vehicle gradually increases, and thus the power module also gradually needs to be able to bear a high current. However, wires of the two main substrates are thin and cannot bear the high current. If a large-area metal plate is used instead of the wire, the high current can be born, but a thermal expansion coefficient of the metal plate is higher than that of the main substrate, which may damage the main substrate and the metal plate under impact of a thermal stress between the main substrate and the metal plate.

SUMMARY

In view of the above, the present disclosure provides a power module. The power module includes a first power input terminal, a second power input terminal, a first main substrate, a second main substrate, a plurality of first switches, a plurality of second switches, and a bridge main unit. The first power input terminal includes a plurality of first connection ports. The second power input terminal includes a plurality of second connection ports. The first main substrate includes a first surface. The second main substrate includes a second surface. Each of the first switches includes a first control terminal, a first input terminal, and a first output terminal. Each of the second switches includes a second control terminal, a second input terminal, and a second output terminal. The bridge main unit is across the first surface and the second surface. The bridge main unit includes at least one first bridge subunit and at least one second bridge subunit. Each of the first bridge subunit and the second bridge subunit includes a bottom surface, a top surface opposite to the bottom surface, a first conducting region, a second conducting region, and a third conducting region. The bottom surface faces the first surface and the second surface. The first conducting region is on the bottom surface. The second conducting region and the third conducting region are on the top surface. The first conducting region of the at least one first bridge subunit is connected between the first output terminals of the first switches and the second input terminals of the second switches. The first conducting region of the at least one second bridge subunit is connected between the first input terminals of the first switches and the first power input terminal or between the second output terminals of the second switches and the second power input terminal, so as to transmit current signals between the first power input terminal, the first switches, the second switches, and the second power input terminal. The second conducting regions of the at least one first bridge subunit and the at least one second bridge subunit are connected to the first control terminals of the first switches and the second control terminals of the second switches, so as to transmit control signals of the first switches and the second switches. The third conducting regions of the at least one first bridge subunit and the at least one second bridge subunit are connected to the first output terminals of the first switches and the second output terminals of the second switches, so as to transmit output signals of the first switches and the second switches.

In summary, according to some embodiments, by using the bridge main unit, the power module can bear a great current signal, and is unlikely to be damaged by impact of a thermal stress. In some embodiments, a current signal of a great current and another type of signal (for example, source signals and gate signals of the first switch and the second switch) may be simultaneously transmitted between the first main substrate and the second main substrate by using the bridge main unit.

DETAILED DESCRIPTION

For ease of description, a quantity of a component illustrated in some embodiments is only one. However, the present disclosure is not limited thereto, and the quantity of the component may be multiple. For ease of description, a quantity of a component illustrated in some embodiments is multiple. However, the present disclosure is not limited thereto, and the quantity of the component may be only one.

Figure 1:
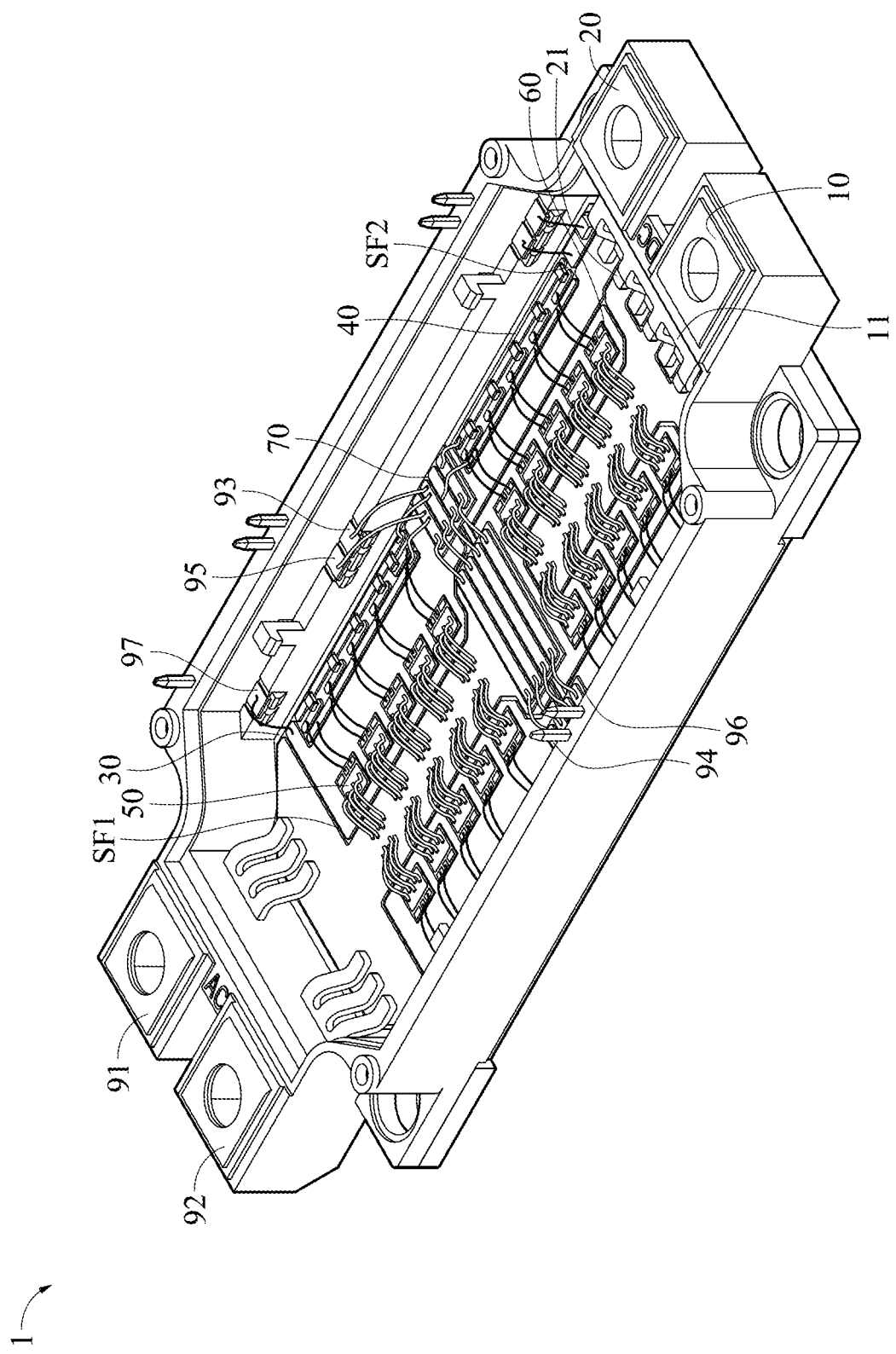
FIG. 1 is a three-dimensional schematic diagram of a power module according to some embodiments of the present disclosure.

FIG. 1 is a three-dimensional schematic diagram of a power module 1 according to some embodiments of the present disclosure. The power module 1 includes a first power input terminal 10, a second power input terminal 20, a first main substrate 30, a second main substrate 40, a plurality of first switches 50, a plurality of second switches 60, and a bridge main unit 70. The first power input terminal 10 includes a plurality of first connection ports 11. The second power input terminal 20 includes a plurality of second connection ports 21. The first main substrate 30 carries the first switch 50. The second main substrate 40 carries the second switch 60. The first power input terminal 10 and the second power input terminal 20 provide direct current power for a circuit formed by the first switch 50 and the second switch 60. For example, the first power input terminal 10 provides a positive potential of the direct current power, and the second power input terminal 20 provides a negative potential of the direct current power. The first main substrate 30 includes a first surface SF1. The second main substrate 40 includes a second surface SF2. The bridge main unit 70 is across the first surface SF1 and the second surface SF2, so as to transmit current signals between the first power input terminal 10, the first switch 50, the second switch 60, and the second power input terminal 20, control signals of the first switch 50 and the second switch 60, and output signals of the first switch 50 and the second switch 60. In some embodiments, the first switch 50 and the second switch 60 may be implemented by electronic switches, for example, an insulated gate bipolar transistor (IGBT) or a circuit formed by connecting an IGBT in parallel with a diode.

In some embodiments, the first main substrate 30 and the second main substrate 40 are separated from each other. For example, the first main substrate 30 and the second main substrate 40 are arranged in a direction parallel to long edges of the first main substrate 30 and the second main substrate 40, and there is a spacing between an edge close to the second main substrate 40 of the first main substrate 30 and the second main substrate 40.

Figure 2:
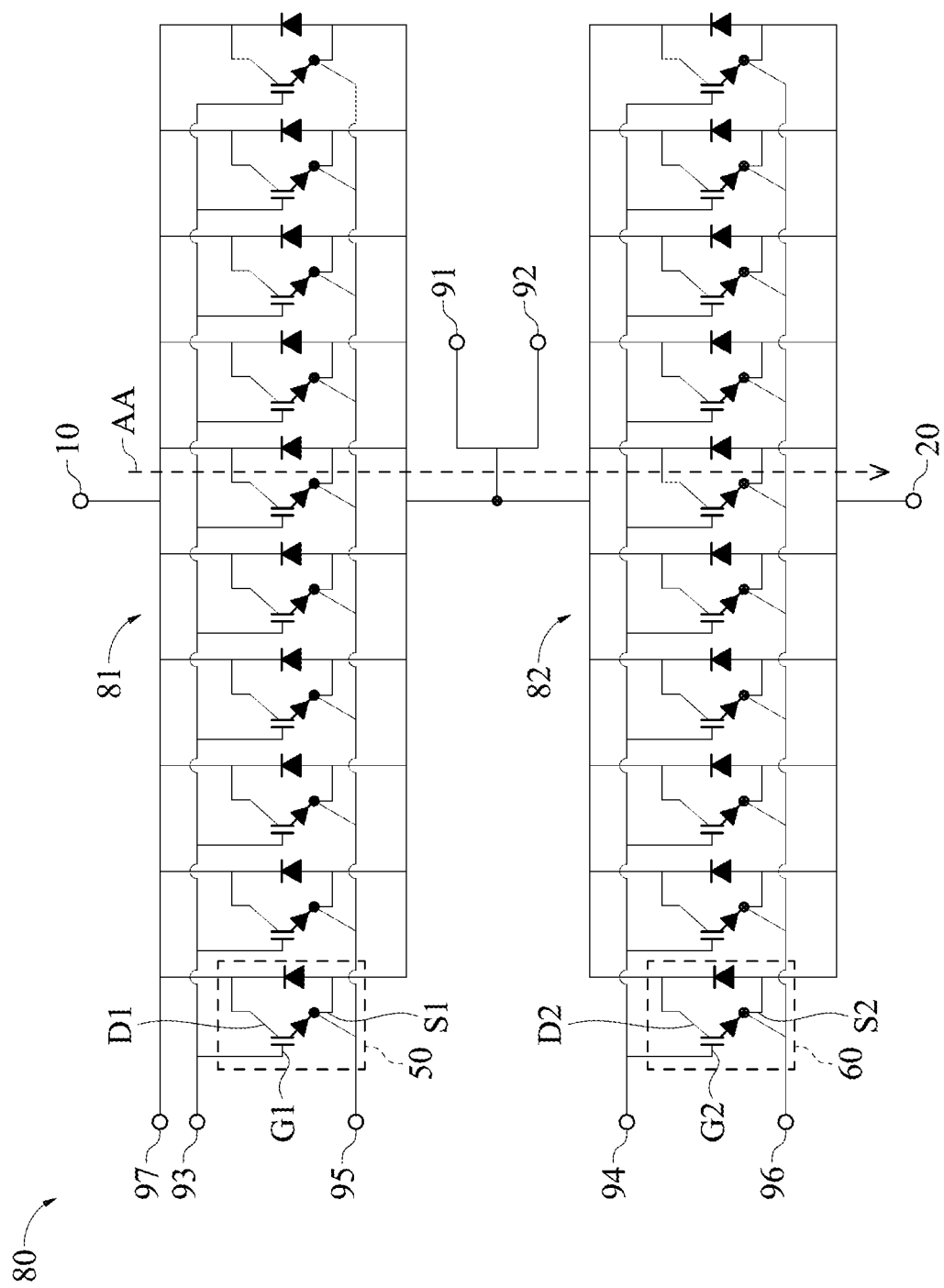
FIG. 2 is a schematic diagram of a switch circuit of a power module according to some embodiments of the present disclosure.

FIG. 2 is a schematic diagram of a switch circuit 80 of the power module 1 according to some embodiments of the present disclosure. The first switch 50 includes a first control terminal G1, a first input terminal D1, and a first output terminal S1. For example, if the first switch 50 is formed by an N-type IGBT, the first control terminal G1 is a gate of the N-type IGBT, the first input terminal D1 is a drain of the N-type IGBT, and the first output terminal S1 is a source of the N-type IGBT. The second switch 60 includes a second control terminal G2, a second input terminal D2, and a second output terminal S2. For example, if the second switch 60 is formed by an N-type IGBT, the second control terminal G2 is a gate of the N-type IGBT, the second input terminal D2 is a drain of the N-type IGBT, and the second output terminal S2 is a source of the N-type IGBT.

As shown in FIG. 2, the switch circuit 80 of the power module 1 includes an upper-arm circuit 81 and a lower-arm circuit 82. The upper-arm circuit 81 is formed by connecting the first switches 50 in parallel. For example, the first input terminals D1 of the first switches 50 are connected to one another, and the first output terminals S1 of the first switches 50 are connected to one another. The lower-arm circuit 82 is formed by connecting the second switches 60 in parallel. For example, the second input terminals D2 of the second switches 60 are connected to one another, and the second output terminals S2 of the second switches 60 are connected to one another. The upper-arm circuit 81 is connected in series with the lower-arm circuit 82. For example, the mutually connected second input terminals D2 of the lower-arm circuit 82 are connected to the mutually connected first output terminals S1 of the upper-arm circuit 81. The first power input terminal 10 is connected to the upper-arm circuit 81, and the second power input terminal 20 is connected to the lower-arm circuit 82, so as to provide the direct current power for the switch circuit 80. For example, the first power input terminal 10 is connected to the mutually connected first input terminals D1 of the upper-arm circuit 81, and the second power input terminal 20 is connected to the mutually connected second output terminals S2 of the lower-arm circuit 82.

In some embodiments, as shown in FIG. 1 and FIG. 2, the power module 1 further includes two power output terminals 91 and 92. The power output terminals 91 and 92 are connected to a series-connection point between the upper-arm circuit 81 and the lower-arm circuit 82. For example, the power output terminals 91 and 92 are connected to the mutually connected first output terminals S1 of the upper-arm circuit 81 and the mutually connected second input terminals D2 of the lower-arm circuit 82. In this way, the power output terminals 91 and 92 may output alternating current power to power an electronic apparatus (for example, a motor). In some embodiments, as shown in FIG. 1 and FIG. 2, the power module 1 further includes two drive terminals 93 and 94 (referred to as a first drive terminal 93 and a second drive terminal 94 respectively hereinafter) for a drive apparatus to connect. The first drive terminal 93 outputs a first control signal to drive the first switch 50 of the upper-arm circuit 81. The second drive terminal 94 outputs a second control signal to drive the second switch 60 of the lower-arm circuit 82. For example, as shown in FIG. 2, the first control terminals G1 of the first switches 50 are connected to one another, and the first control signal is obtained from the first drive terminal 93. The second control terminals G2 of the second switches 60 are connected to one another, and the second control signal is obtained from the second drive terminal 94. In some embodiments, as shown in FIG. 1 and FIG. 2, the power module 1 further includes two detection terminals 95 and 96 (referred to as a first detection terminal 95 and a second detection terminal 96 respectively hereinafter) for a measurement apparatus (for example, an ammeter) to connect, such that the measurement apparatus learns current values consumed by the upper-arm circuit 81 and the lower-arm circuit 82. For example, as shown in FIG. 2, the mutually connected first output terminals S1 of the upper-arm circuit 81 generate and transmit first output signals to the first detection terminal 95. The first output signal is a current signal output by the first output terminal S1. The mutually connected second output terminals S2 of the lower-arm circuit 82 generate and transmit second output signals to the second detection terminal 96. The second output signal is a current signal output by the second output terminal S2. In some embodiments, as shown in FIG. 1 and FIG. 2, the power module 1 further includes a power current terminal 97 for the measurement apparatus to connect, such that the measurement apparatus learns a current value provided for the switch circuit 80 (that is, a current value of a current signal from the first power input terminal 10). For example, as shown in FIG. 2, the first power input terminal 10 outputs the current signal to the power current terminal 97.

Figure 3:
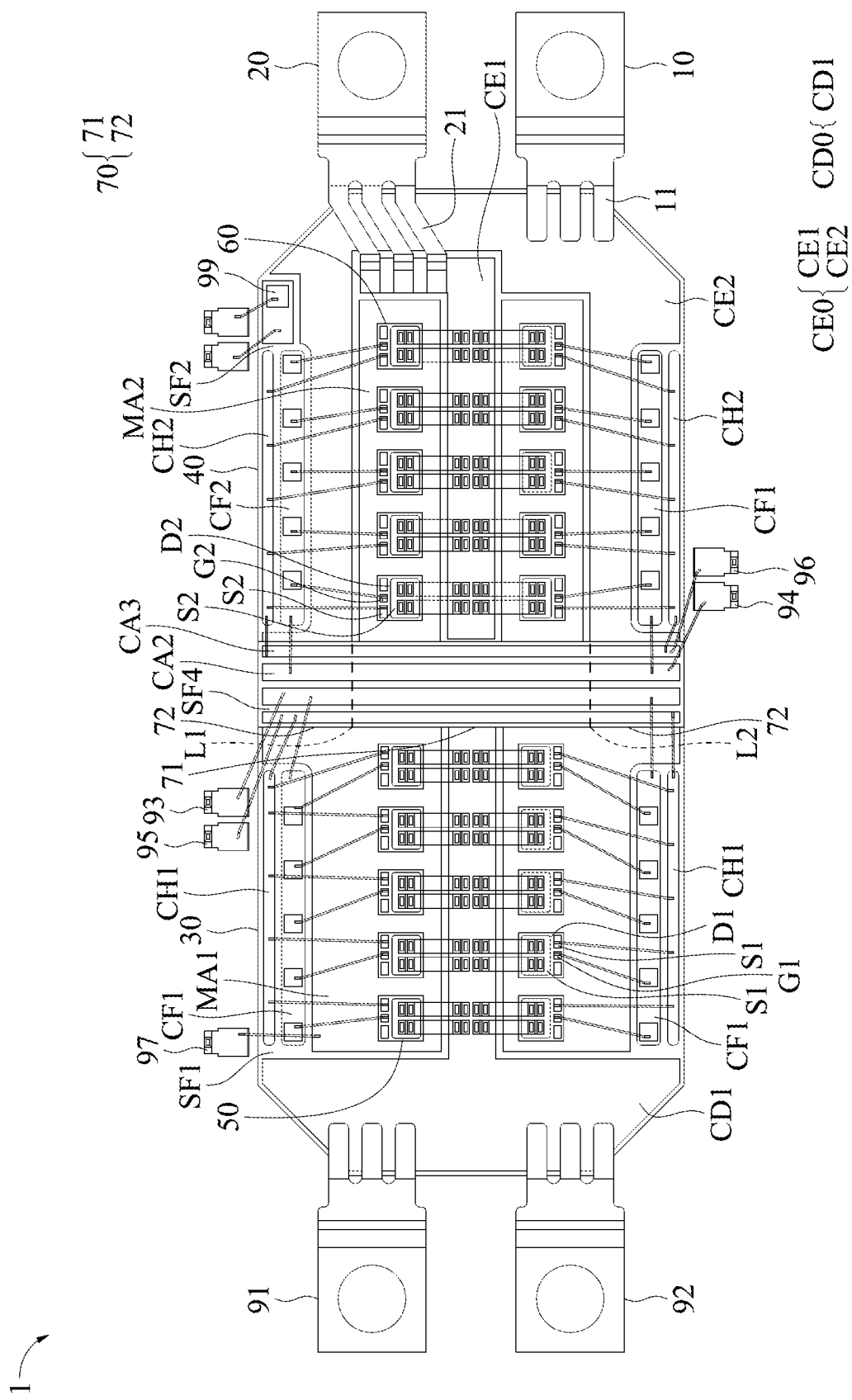
FIG. 3 is a top view of a power module according to a first embodiment of the present disclosure.
Figure 4:
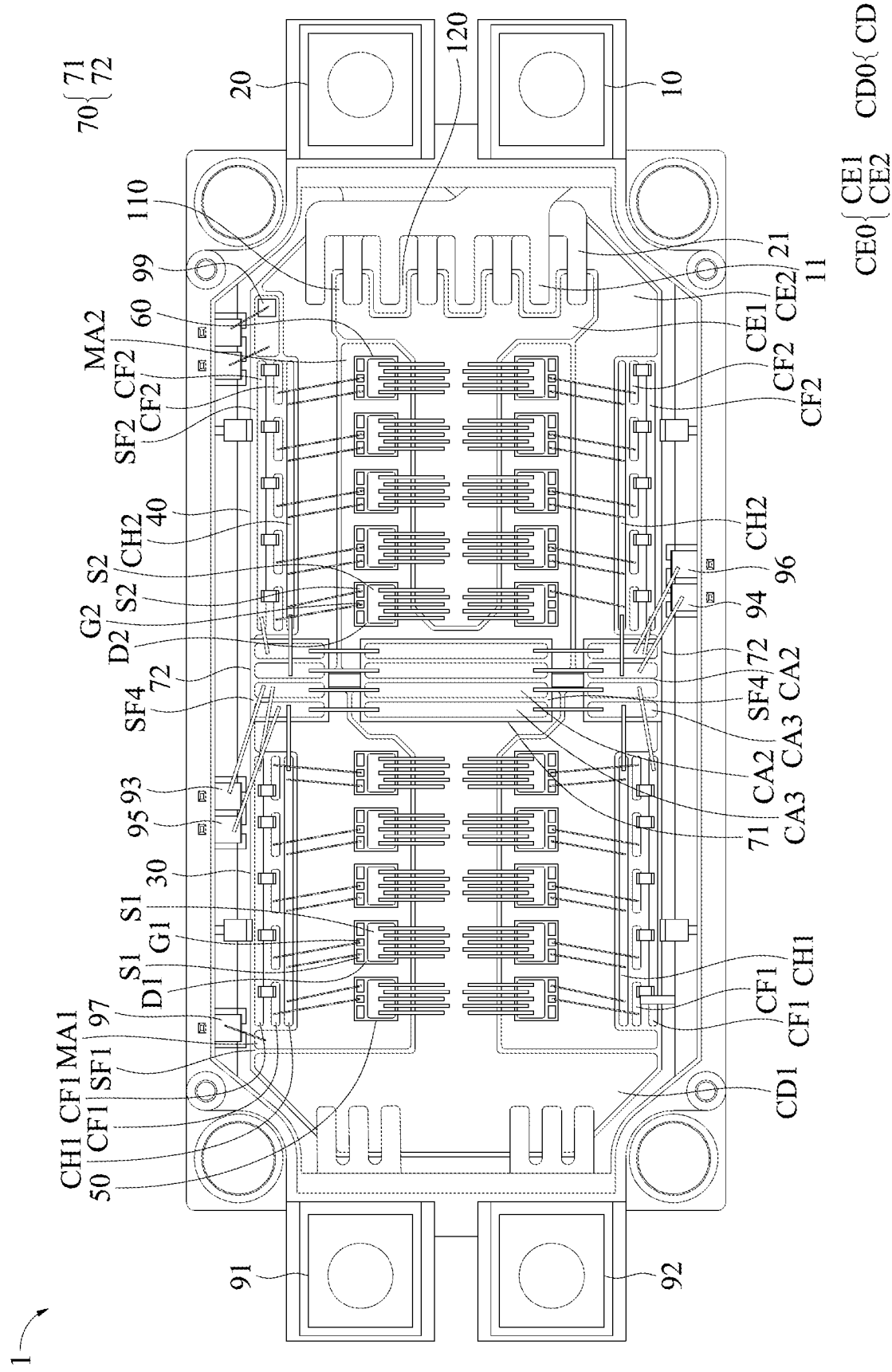
FIG. 4 is a top view of a power module according to a second embodiment of the present disclosure.
Figure 5:
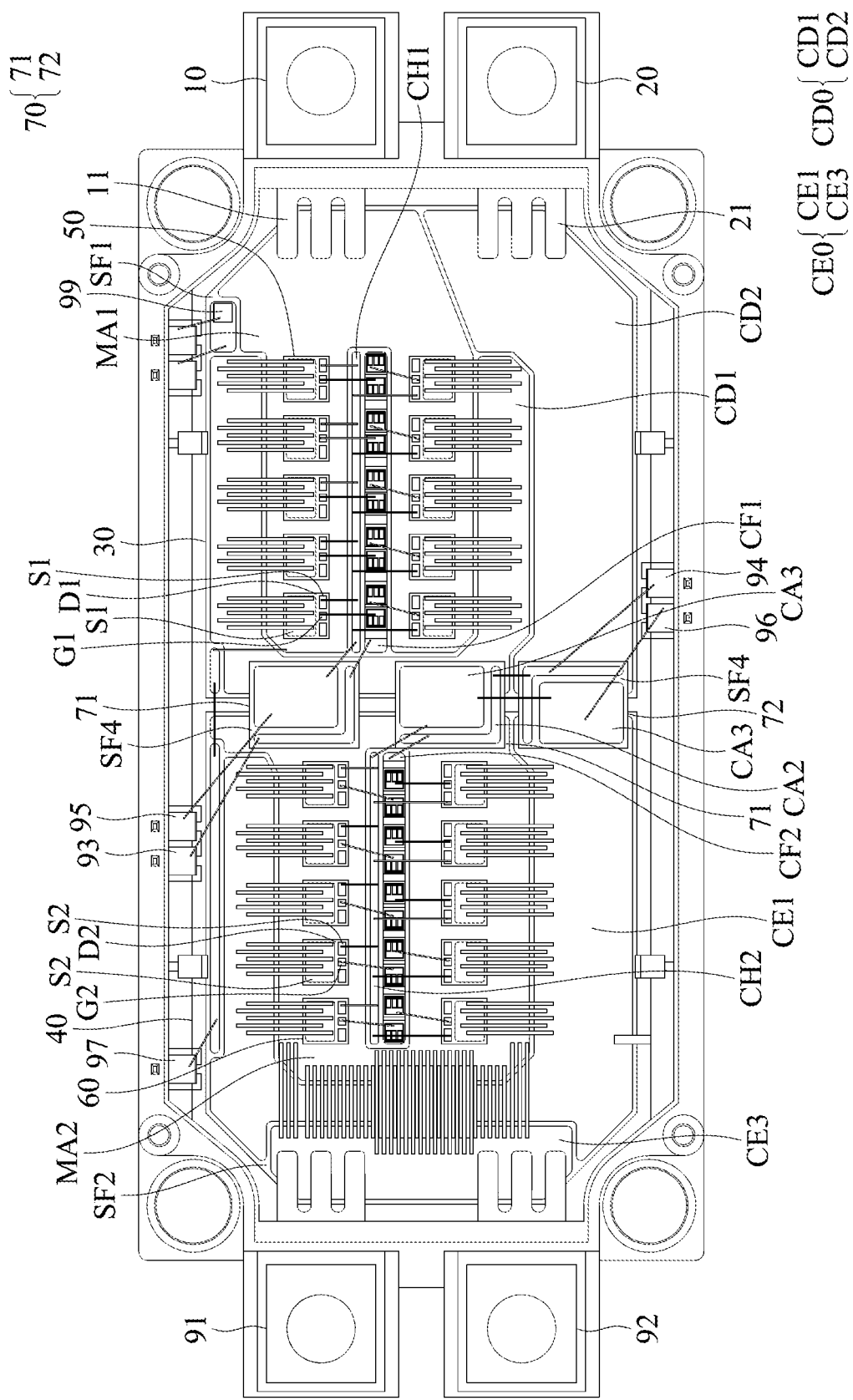
FIG. 5 is a top view of a power module according to a third embodiment of the present disclosure.
Figure 6:
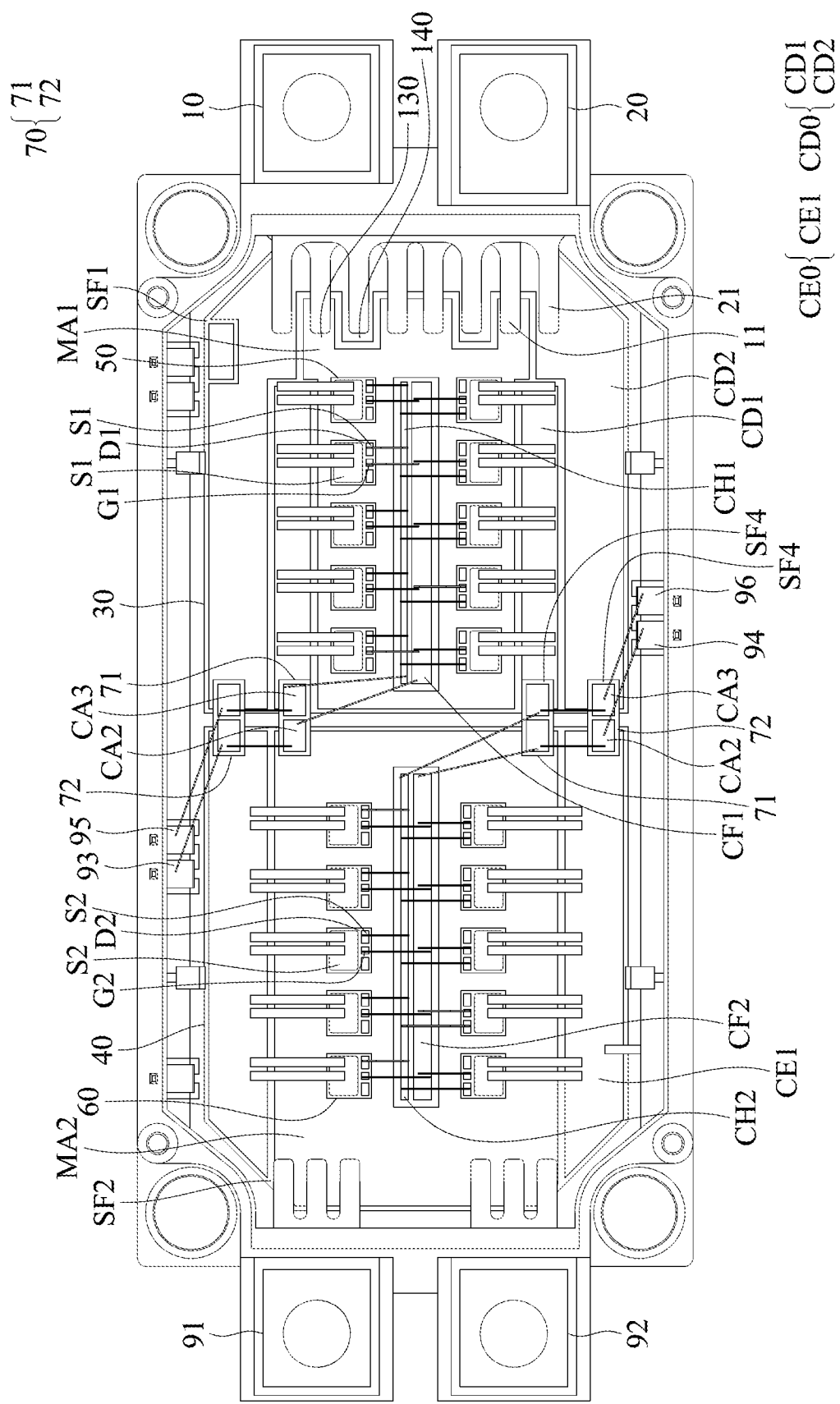
FIG. 6 is a top view of a power module according to a fourth embodiment of the present disclosure.

Refer to FIG. 3 to FIG. 6. FIG. 3 is a top view of the power module 1 according to a first embodiment of the present disclosure. FIG. 4 is a top view of the power module 1 according to a second embodiment of the present disclosure. FIG. 5 is a top view of the power module 1 according to a third embodiment of the present disclosure. FIG. 6 is a top view of the power module 1 according to a fourth embodiment of the present disclosure. The bridge main unit 70 is across the first surface SF1 and the second surface SF2. The bridge main unit 70 includes at least one first bridge subunit 71 and at least one second bridge subunit 72. In some embodiments, as shown in FIG. 4 to FIG. 6, each of the first bridge subunit 71 and the second bridge subunit 72 is independent. That is, the first bridge subunit 71 and the second bridge subunit 72 are separated and have a spacing between each other. In some other embodiments, as shown in FIG. 3, the first bridge subunit 71 and the second bridge subunit 72 are connected. For example, as shown in FIG. 3, the bridge main unit 70 is divided, by two axes L1 and L2 parallel to a long edge direction of the first main substrate 30 and the second main substrate 40, into two second bridge subunits 72 and a first bridge subunit 71 connected between the two second bridge subunits 72. Compared with the first bridge subunit 71 and the second bridge subunit 72 that are connected, the first bridge subunit 71 and the second bridge subunit 72 that are independent can reduce a thermal stress effect.

Figure 7:
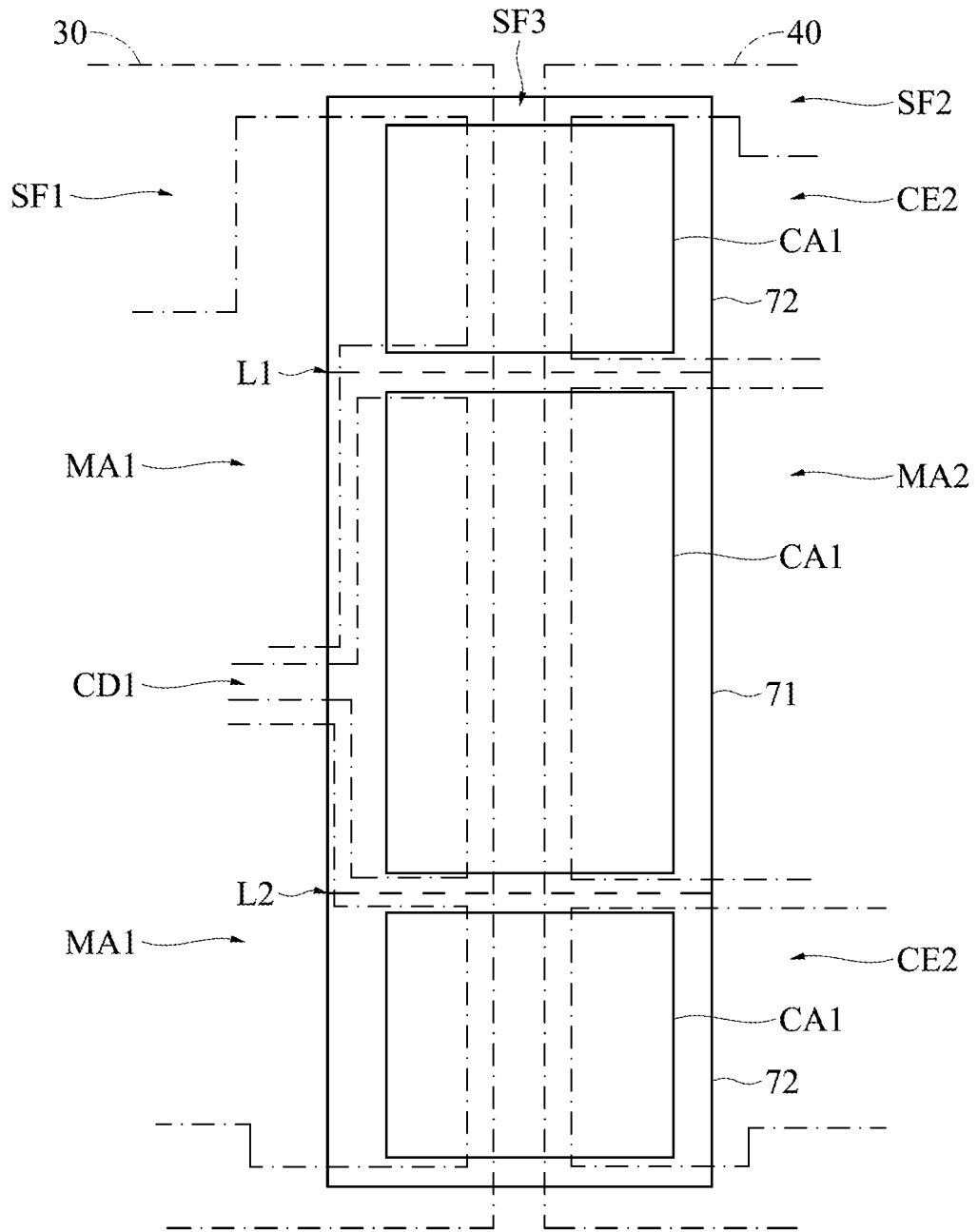
FIG. 7 is a bottom view of a bridge main unit according to the first embodiment of the present disclosure.
Figure 8:
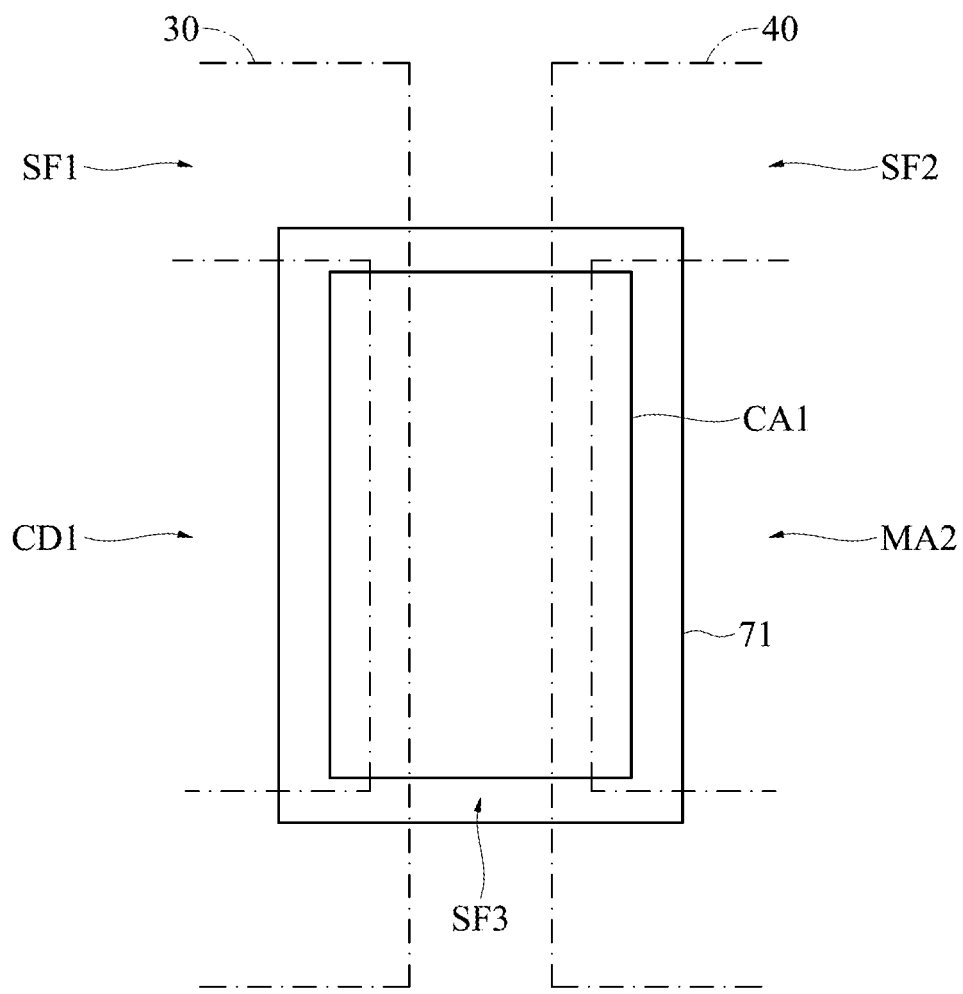
FIG. 8 is a bottom view of a first bridge subunit according to the second embodiment of the present disclosure.
Figure 9:
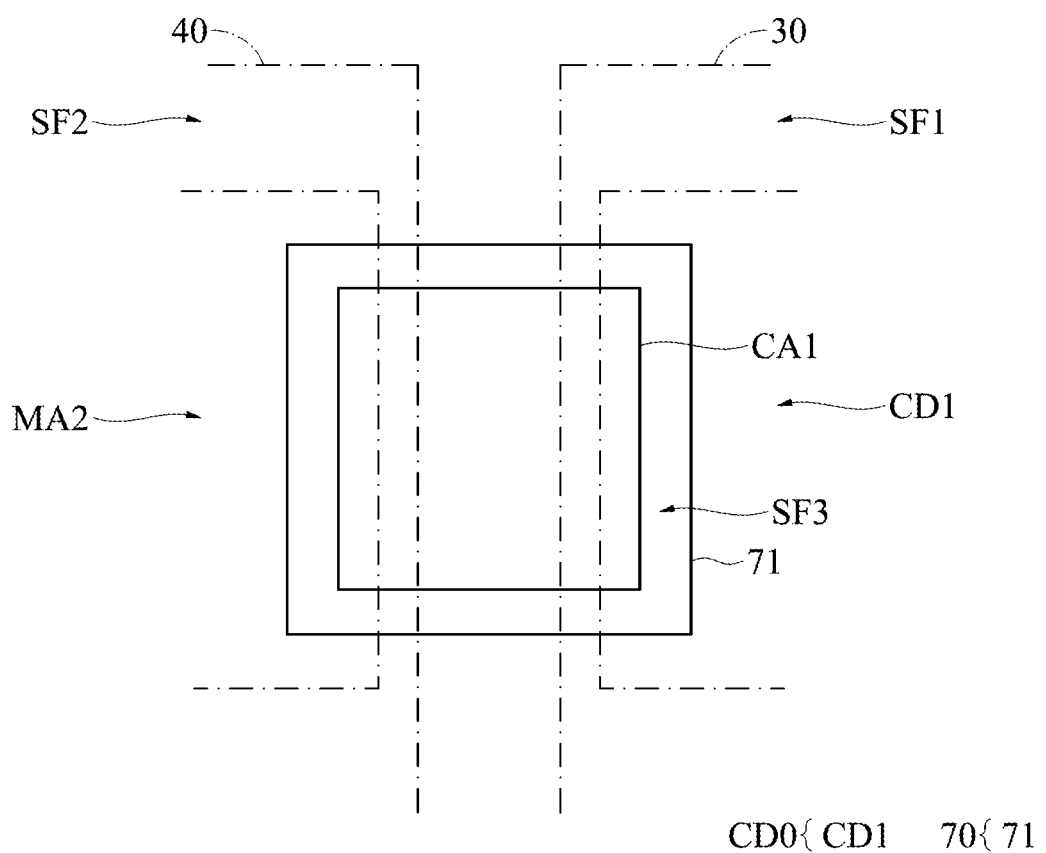
FIG. 9 is a bottom view of a first bridge subunit according to the third embodiment of the present disclosure.
Figure 10:
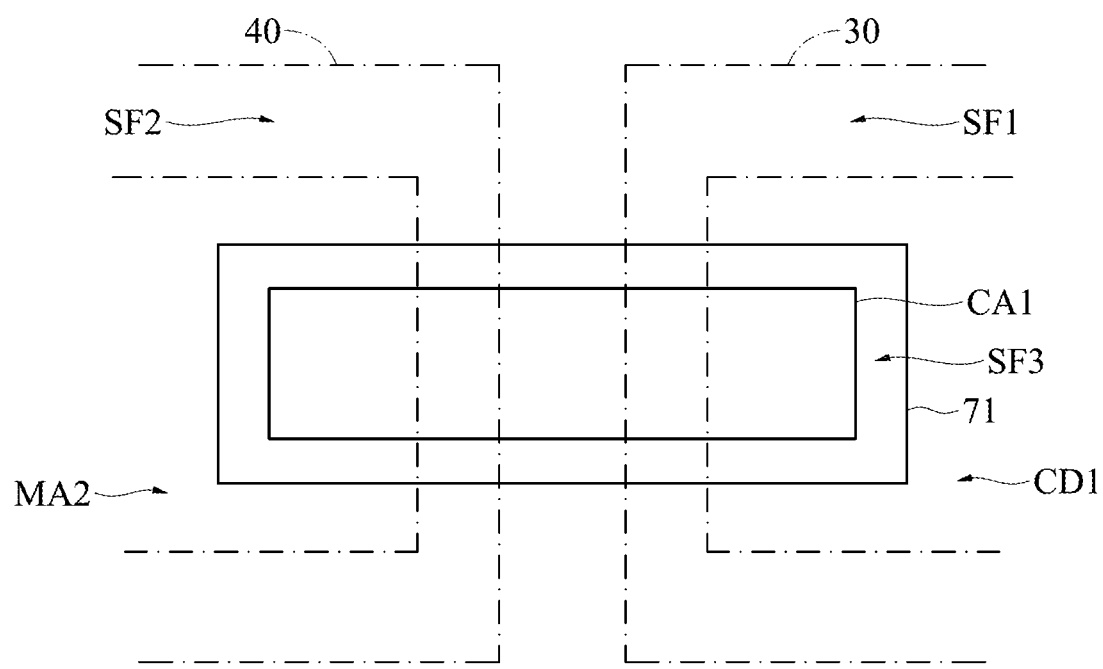
FIG. 10 is a bottom view of a first bridge subunit according to the fourth embodiment of the present disclosure.
Figure 11:
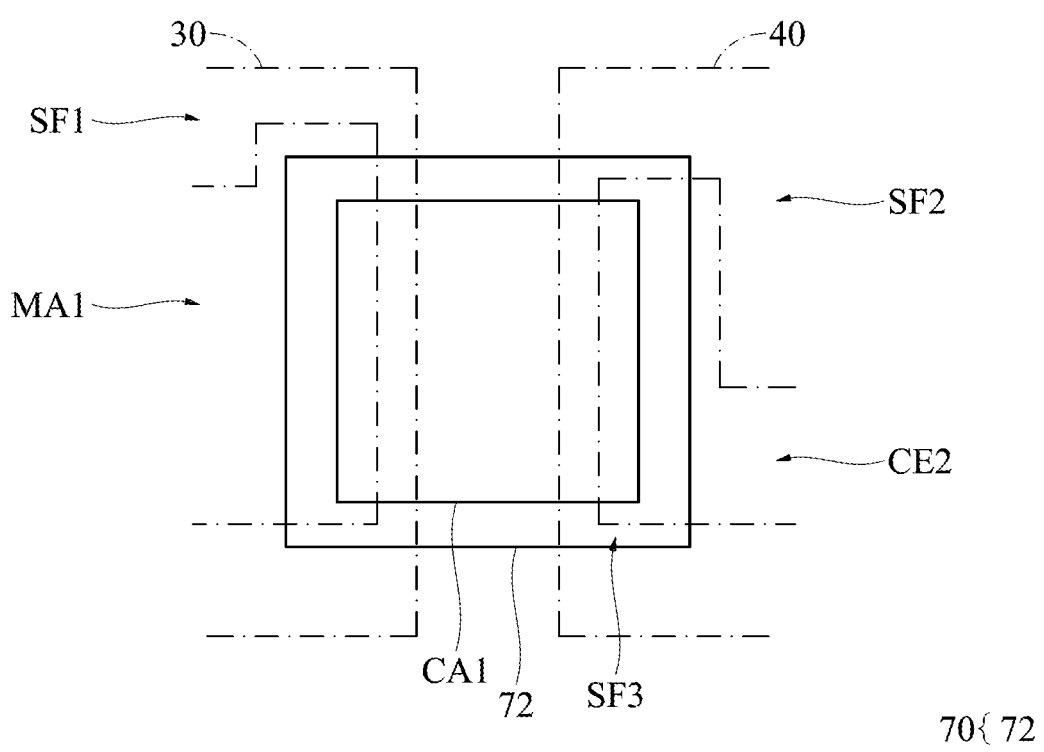
FIG. 11 is a bottom view of a second bridge subunit according to the second embodiment of the present disclosure.
Figure 12:
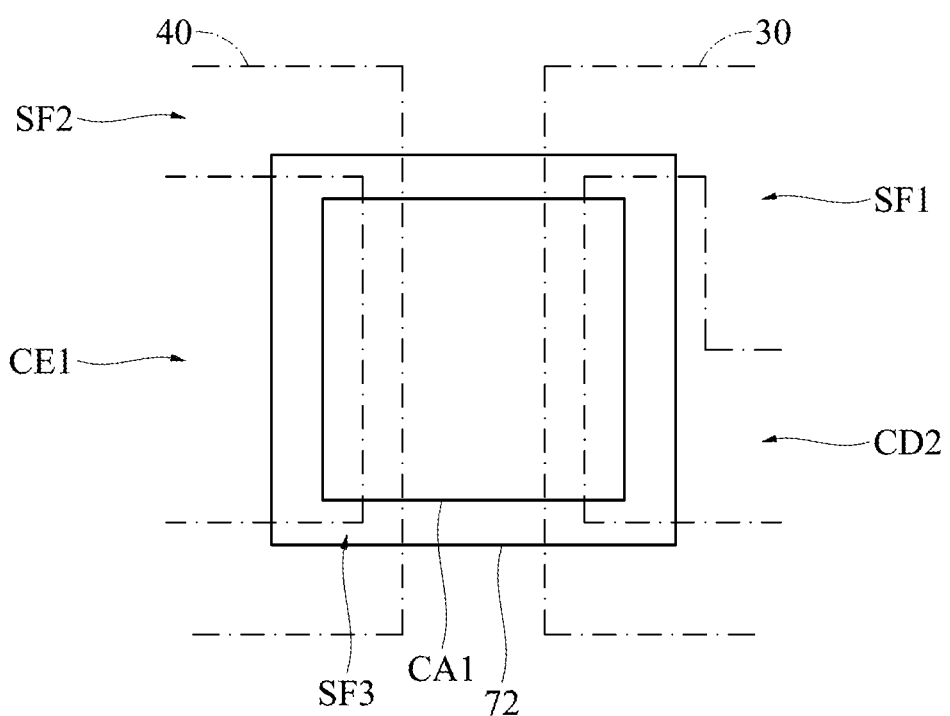
FIG. 12 is a bottom view of a second bridge subunit according to the third embodiment of the present disclosure.
Figure 13:
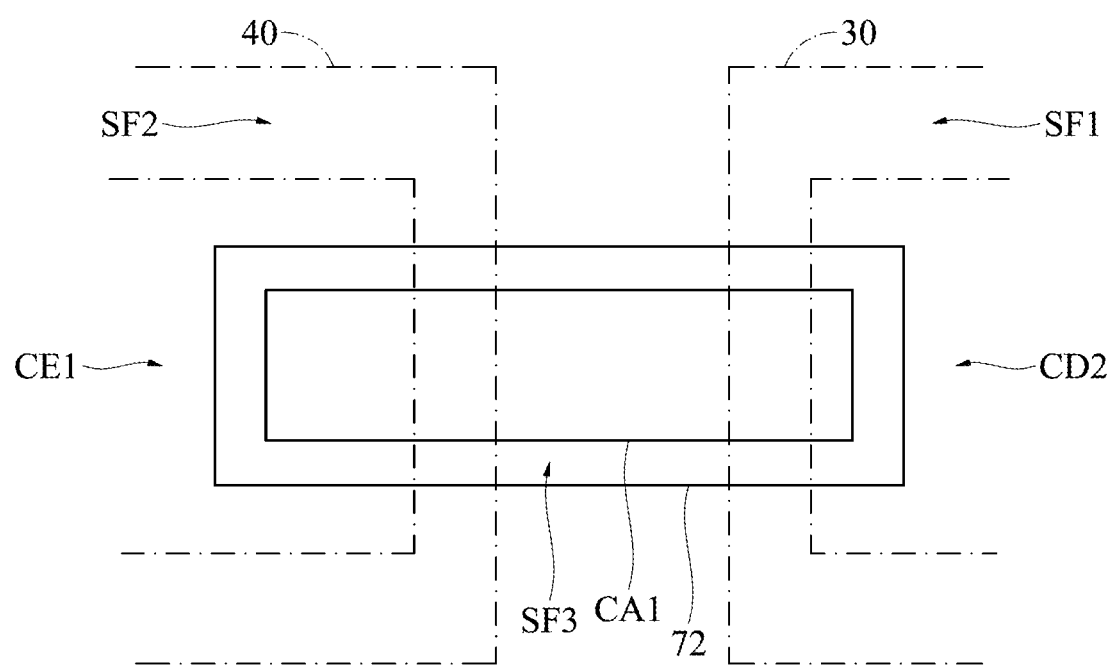
FIG. 13 is a bottom view of a second bridge subunit according to the fourth embodiment of the present disclosure.

Refer to FIG. 3 to FIG. 13. FIG. 7 is a bottom view of the bridge main unit 70 according to the first embodiment of the present disclosure. FIG. 8 is a bottom view of the first bridge subunit 71 according to the second embodiment of the present disclosure. FIG. 9 is a bottom view of the first bridge subunit 71 according to the third embodiment of the present disclosure. FIG. 10 is a bottom view of the first bridge subunit 71 according to the fourth embodiment of the present disclosure. FIG. 11 is a bottom view of the second bridge subunit 72 according to the second embodiment of the present disclosure. FIG. 12 is a bottom view of the second bridge subunit 72 according to the third embodiment of the present disclosure. FIG. 13 is a bottom view of the second bridge subunit 72 according to the fourth embodiment of the present disclosure. Each of the first bridge subunit 71 and the second bridge subunit 72 includes a bottom surface SF3, a top surface SF4 opposite to the bottom surface SF3, a first conducting region CA1, a second conducting region CA2, and a third conducting region CA3. The bottom surface SF3 faces the first surface SF1 and the second surface SF2. That is, the bottom surface SF3 is an inner surface, while the top surface SF4 is an outer surface. The first conducting region CA1 is on the bottom surface SF3. The second conducting region CA2 and the third conducting region CA3 are on the top surface SF4.

The first conducting region CA1 of the first bridge subunit 71 is connected between the first output terminal S1 of the first switch 50 and the second input terminal D2 of the second switch 60, so as to transmit a current signal from the first output terminal S1 of the first switch 50 to the second input terminal D2 of the second switch 60. Specifically, the first output terminal S1 of the first switch 50 and the second input terminal D2 of the second switch 60 are connected to mounting main regions and/or power main regions on the first surface SF1 and the second surface SF2 (which will be described in detail later), and the first conducting region CA1 of the first bridge subunit 71 is connected to the mounting main regions and/or power main regions on the first surface SF1 and the second surface SF2 (which will be described in detail later), so as to transmit the current signal from the first output terminal S1 of the first switch 50 to the second input terminal D2 of the second switch 60.

The first conducting region CA1 of the second bridge subunit 72 is connected between the first input terminal D1 of the first switch 50 and the first power input terminal 10, so as to transmit the current signal from the first power input terminal 10 to the first input terminal D1 of the first switch 50. Alternatively, the first conducting region CA1 of the second bridge subunit 72 is connected between the second output terminal S2 of the second switch 60 and the second power input terminal 20, so as to transmit a current signal from the second output terminal S2 of the second switch 60 to the second power input terminal 20. Specifically, as shown in FIG. 3 and FIG. 4, the first input terminal D1 of the first switch 50 and the first connection port 11 of the first power input terminal 10 are connected to the mounting main regions and/or the power main regions on the first surface SF1 and the second surface SF2 (which will be described in detail later), and the first conducting region CA1 of the second bridge subunit 72 is connected to the mounting main regions and/or power main regions on the first surface SF1 and the second surface SF2 (which will be described in detail later), so as to transmit the current signal from the first power input terminal 10 to the first input terminal D1 of the first switch 50. As shown in FIG. 5 and FIG. 6, the second output terminal S2 of the second switch 60 and the second connection port 21 of the second power input terminal 20 are connected to the mounting main regions and/or the power main regions on the first surface SF1 and the second surface SF2 (which will be described in detail later), and the first conducting region CA1 of the second bridge subunit 72 is connected to the mounting main regions and/or power main regions on the first surface SF1 and the second surface SF2 (which will be described in detail later), so as to transmit the current signal from the second output terminal S2 of the second switch 60 to the second power input terminal 20. Therefore, the first bridge subunit 71 and the second bridge subunit 72 may form a current path AA (as shown in FIG. 2) with the first power input terminal 10, the first switch 50, the second switch 60, and the second power input terminal 20, so as to transmit the current signals between the first power input terminal 10, the first switch 50, the second switch 60, and the second power input terminal 20. A current value of the current signal may be greater than 450 amperes.

The second conducting regions CA2 of the first bridge subunit 71 and the second bridge subunit 72 are connected to the first control terminal G1 of the first switch 50 and the second control terminal G2 of the second switch 60, so as to transmit control signals for the first switch 50 and the second switch 60. Specifically, as shown in FIG. 3 to FIG. 6, the first drive terminal 93 and the second drive terminal 94 are connected to the second conducting regions CA2 of the first bridge subunit 71 and/or the second bridge subunit 72 (which will be described in detail later). The first control terminal G1 of the first switch 50 and the second control terminal G2 of the second switch 60 are connected to control main regions on the first surface SF1 and the second surface SF2 (which will be described in detail later). The second conducting regions CA2 of the first bridge subunit 71 and the second bridge subunit 72 are connected to the control main regions on the first surface SF1 and the second surface SF2 (which will be described in detail later). Therefore, the second conducting regions CA2 of the first bridge subunit 71 and the second bridge subunit 72 may transmit the first control signal and the second control signal that are from the first drive terminal 93 and the second drive terminal 94 to the first control terminal G1 of the first switch 50 and the second control terminal G2 of the second switch 60.

The third conducting regions CA3 of the first bridge subunit 71 and the second bridge subunit 72 are connected to the first output terminal S1 of the first switch 50 and the second output terminal S2 of the second switch 60, so as to transmit the output signals of the first switch 50 and the second switch 60. Specifically, as shown in FIG. 3 to FIG. 6, the first detection terminal 95 and the second detection terminal 96 are connected to the third conducting regions/region CA3 of the first bridge subunit 71 and/or the second bridge subunit 72 (which will be described in detail later). The first output terminal S1 of the first switch 50 and the second output terminal S2 of the second switch 60 are connected to detection main regions on the first surface SF1 and the second surface SF2 (which will be described in detail later). The third conducting regions CA3 of the first bridge subunit 71 and the second bridge subunit 72 are connected to the detection main regions on the first surface SF1 and the second surface SF2 (which will be described in detail later). Therefore, the third conducting regions CA3 of the first bridge subunit 71 and the second bridge subunit 72 may transmit the first output signal and the second output signal that are from the first output terminal S1 and the second output terminal S2 to the first detection terminal 95 and the second detection terminal 96.

In some embodiments, the first main substrate 30 and the second main substrate 40 may be formed by substrates (for example, ceramic substrates) made from a material with a low thermal expansion coefficient. The first bridge subunit 71 and the second bridge subunit 72 may be formed by substrates made from a material with a low thermal expansion coefficient. Compared with a large-area metal plate, the substrate made from the material with the low thermal expansion coefficient is unlikely to be damaged by a thermal stress. The mounting main regions, the power main regions, the control main regions, and the detection main regions on the first surface SF1 and the second surface SF2 are made from a conductive material. The first conducting region CA1, the second conducting region CA2, and the third conducting region CA3 are made from a conductive material. Specifically, the conductive material may be a metal layer, which formed by patterning the metal layer laid on the substrate by dry etching, wet etching, or the like. The metal layer may be made from a conductive metal, for example, copper or aluminum. The mounting main region, the power main region, the control main region, and the detection main region on the first surface SF1 are separated and have a spacing between one another. The mounting main region, the power main region, the control main region, and the detection main region on the second surface SF2 are separated and have a spacing between one another. The second conducting region CA2 and the third conducting region CA3 in the first bridge subunit 71 and the second bridge subunit 72 are separated and have a spacing between each other.

As shown in FIG. 3 to FIG. 6, in some embodiments, the first bridge subunit 71 and the second bridge subunit 72 are arranged in a direction parallel to short edges of the first main substrate 30 and the second main substrate 40. In some embodiments, the second conducting regions CA2 transmitting the same control signal in the first bridge subunit 71 and the second bridge subunit 72 may be connected to each other (for example, connected to each other through a connecting member). For example, the second conducting regions CA2 transmitting the first control signal (the second control signal) in the first bridge subunit 71 and the second bridge subunit 72 are connected to each other. In some embodiments, the third conducting regions CA3 transmitting the same output signal in the first bridge subunit 71 and the second bridge subunit 72 may be connected to each other (for example, connected to each other through a connecting member). For example, the third conducting regions CA3 transmitting the first output signal (the second output signal) in the first bridge subunit 71 and the second bridge subunit 72 are connected to each other.

As shown in FIG. 3 to FIG. 6, in some embodiments, the first main substrate 30 further includes a first mounting main region MA1 on the first surface SF1. The second main substrate 40 further includes a second mounting main region MA2 on the second surface SF2. The first input terminal D1 of the first switch 50 is connected to the first mounting main region MA1. The second input terminal D2 of the second switch 60 is connected to the second mounting main region MA2. In some embodiments, the first switch 50 is arranged in the first mounting main region MA1 in a two-dimensional array, and the second switch 60 is arranged in the second mounting main region MA2 in a two-dimensional array. In some embodiments, the first mounting main region MA1 includes two first mounting subregions. Some of the first switches 50 are arranged in one of the two first mounting subregions in a direction parallel to long edges of the first main substrate 30 and the second main substrate 40, and the other first switches 50 are arranged in the other of the two first mounting subregions in the direction parallel to the long edges of the first main substrate 30 and the second main substrate 40. The second mounting main region MA2 includes two second mounting subregions. Some of the second switches 60 are arranged in one of the two second mounting subregions in a direction parallel to second long edges of the first main substrate 30 and the second main substrate 40, and the other second switches 60 are arranged in the other of the two second mounting subregions in the direction parallel to the long edges of the first main substrate 30 and the second main substrate 40.

As shown in FIG. 3 to FIG. 10, in some embodiments, the first main substrate 30 further includes a first power main region CD0 on the first surface SF1. The first power main region CD0 includes at least one first power subregion CD1 connected to the first output terminal S1 of the first switch 50. Two sides of the first conducting region CA1 of the first bridge subunit 71 are connected to the first power subregion CD1 and the second mounting main region MA2 respectively. In some embodiments, the first power subregion CD1 is close to the first mounting main region MA1.

For example, as shown in FIG. 3 and FIG. 4, in the first embodiment and the second embodiment, the first power subregion CD1 has a wire bonding main region and a connection main region. The connection main region is connected to the wire bonding main region. The wire bonding main region of the first power subregion CD1 is connected to the first output terminal S1 of the first switch 50 through a connecting member. The wire bonding main region of the first power subregion CD1 is between the two first mounting subregions of the first mounting main region MA1. As shown in FIG. 5, in the third embodiment, the first power subregion CD1 surrounds the two first mounting subregions of the first mounting main region MA1 in an open loop for the first output terminal S1 of the first switch 50 to connect through the connecting member. A notch of the open loop is away from the bridge main unit 70. As shown in FIG. 6, in the fourth embodiment, the first power subregion CD1 has two branch regions on two sides of the first mounting main region MA1 respectively for the first output terminal S1 of the first switch 50 to connect through the connecting member.

In some embodiments, when the first conducting region CA1 of the second bridge subunit 72 is connected between the first input terminal D1 of the first switch 50 and the first power input terminal 10 (which will be described in detail later), the two power output terminals 91 and 92 are connected to the first power subregion CD1 of the first power main region CD0. As shown in FIG. 3 and FIG. 4, in the first embodiment and the second embodiment (that is, the first conducting region CA1 of the second bridge subunit 72 is connected between the first input terminal D1 of the first switch 50 and the first power input terminal 10), the two power output terminals 91 and 92 are connected to the connection main region of the first power subregion CD1 of the first power main region CD0.

As shown in FIG. 3 to FIG. 6, in some embodiments, the second main substrate 40 further includes a second power main region CE0 on the second surface SF2. The second power main region CE0 includes at least one second power subregion CE1 connected to the second output terminal S2 of the second switch 60 and the second power input terminal 20. In some embodiments, the second power subregion CE1 is close to the second mounting main region MA2.

For example, as shown in FIG. 3 and FIG. 4, in the first embodiment and the second embodiment, the second power subregion CE1 has a connection main region and a wire bonding main region. The connection main region is connected to the wire bonding main region. The wire bonding main region of the second power subregion CE1 is connected to the second output terminal S2 of the second switch 60 through a connecting member. The second connection port 21 of the second power input terminal 20 is connected to the connection main region of the second power subregion CE1. The wire bonding main region of the second power subregion CE1 is between the two second mounting subregions of the second mounting main region MA2. As shown in FIG. 5, in the third embodiment, the second power subregion CE1 surrounds the second mounting main region MA2 in an open loop for the second output terminal S2 of the second switch 60 to connect through the connecting member. The second power subregion CE1 is connected to the second connection port 21 of the second power input terminal 20 through the first conducting region CA1 of the second bridge subunit 72 and a fourth power subregion CD2 of the first power main region (which will be described in detail later). A notch of the open loop is close to the bridge main unit 70. As shown in FIG. 6, in the fourth embodiment, the second power subregion CE1 has two branch regions on two sides of the second mounting main region MA2 respectively for the second output terminal S2 of the second switch 60 to connect through the connecting member. The second power subregion CE1 is connected to the second connection port 21 of the second power input terminal 20 through the first conducting region CA1 of the second bridge subunit 72 and the fourth power subregion CD2 of the first power main region (which will be described in detail later).

As shown in FIG. 3, FIG. 4, FIG. 7, and FIG. 11, in the first embodiment and the second embodiment, the second power main region CE0 includes at least one third power subregion CE2 connected to the first connection port 11 of the first power input terminal 10. Two sides of the first conducting region CA1 of the second bridge subunit 72 are connected to the first mounting main region MA1 and the third power subregion CE2 respectively. Since the first mounting main region MA1 is connected to the first input terminal D1 of the first switch 50, and the third power subregion CE2 is connected to the first connection port 11 of the first power input terminal 10, in the first embodiment and the second embodiment, the first conducting region CA1 of the second bridge subunit 72 is connected between the first input terminal D1 of the first switch 50 and the first power input terminal 10 through the first mounting main region MA1 and the third power subregion CE2.

As shown in FIG. 3 and FIG. 4, in the first embodiment and the second embodiment, the third power subregion CE2 surrounds the second mounting main region MA2 and the second power subregion CE1 to form an open loop with a notch. The bridge main unit 70 is close to the notch of the open loop.

As shown in FIG. 5, FIG. 6, FIG. 12, and FIG. 13, in the third embodiment and the fourth embodiment, the second power subregion CE1 of the second power main region CE0 is connected to the second output terminal S2 of the second switch 60. Specifically, the second power subregion CE1 of the second power main region CE0 is connected to the second output terminal S2 of the second switch 60 through the connecting member. The first power main region CD0 includes at least one fourth power subregion CD2 connected to the second connection port 21 of the second power input terminal 20. Two sides of the first conducting region CA1 of the second bridge subunit 72 are connected to the second power subregion CE1 and the fourth power subregion CD2 respectively. Since the second power subregion CE1 is connected to the second output terminal S2 of the second switch 60, and the fourth power subregion CD2 is connected to the second connection port 21 of the second power input terminal 20, in the third embodiment and the fourth embodiment, the first conducting region CA1 of the second bridge subunit 72 is connected between the second output terminal S2 of the second switch 60 and the second power input terminal 20 through the second power subregion CE1 and the fourth power subregion CD2.

In some embodiments, the fourth power subregion CD2 is close to the first power subregion CD1. For example, as shown in FIG. 5, in the third embodiment, the fourth power subregion CD2 is on one side of the first power subregion CD1. As shown in FIG. 6, in the fourth embodiment, the fourth power subregion CD2 surrounds the first power subregion CD1 and the first mounting main region MA1 in an open loop. A notch of the open loop is close to the bridge main unit 70.

As shown in FIG. 5 and FIG. 6, in the third embodiment and the fourth embodiment (that is, the first conducting region CA1 of the second bridge subunit 72 is connected between the second output terminal S2 of the second switch 60 and the second power input terminal 20), the two power output terminals 91 and 92 are connected to the second mounting main region MA2. A difference of the third embodiment (as shown in FIG. 5) from the fourth embodiment lies on that the second power main region CE0 includes at least one fifth power subregion CE3. The fifth power subregion CE3 is close to the second power subregion CE1 of the second power main region CE0. For example, the fifth power subregion CE3 is on one side of the second power subregion CE1 and away from the bridge main unit

70. The two power output terminals 91 and 92 are connected to the fifth power subregion CE3. The fifth power subregion CE3 is connected (specifically, connected through a connecting member) to the second mounting main region MA2. The connecting member between the fifth power subregion CE3 and the second mounting main region MA2 may include a first connecting sub-member and a second connecting sub-member. An example in which the connecting member is implemented by a wire is used for description. The connecting member needs a specific quantity of wires, so as to bear a high current. However, due to a limitation on a length of an edge, close to the fifth power subregion CE3, of the second mounting main region MA2, not all the wires may be arranged on the same plane. Therefore, the connecting member satisfies the specific quantity of wires in a manner that some wires (first connecting sub-members) are arranged on a first plane to be connected between the fifth power subregion CE3 and the second mounting main region MA2 and the other wires (second connecting sub-members) are arranged on a second plane overlapping the first plane to be connected between the fifth power subregion CE3 and the second mounting main region MA2.

As shown in FIG. 4 and FIG. 6, in some embodiments, the first connection ports 11 of the first power input terminal 10 and the second connection ports 21 of the second power input terminal 20 are arranged alternately in pairs on the first surface SF1 of the first main substrate 30 or the second surface SF2 of the second main substrate 40 in a direction parallel to short edges of the first main substrate 30 and the second main substrate 40. The first connection ports 11 and the second connection ports 21 are separated and have a spacing between each other. For example, as shown in FIG. 4, there is a second connection port 21 between every two first connection ports 11, such that the first connection ports 11 and the second connection ports 21 are arranged alternately in pairs. That is, the first connection ports 11 and the second connection ports 21 are arranged alternately one by one. However, the present disclosure is not limited thereto. For example, as shown in FIG. 6, the two first connection ports 11 close to the long edges of the first main substrate 30 are between different two second connection ports 21 respectively, and all the other first connection ports 11 (that is, the first connection ports 11 away from the long edges of the first main substrate 30) are between the same two second connection ports 21. In this way, parasitic inductance of the power module 1 can be reduced.

As shown in FIG. 4, in some embodiments, the second power subregion of the second power main region CE0 has a plurality of first connection regions 110 for the second connection ports 21 of the second power input terminal 20 to connect. Specifically, each of the first connection regions 110 is used for one second connection port 21 to connect. The third power subregion CE2 of the second power main region CE0 has a plurality of second connection regions 120 for the first connection ports 11 of the first power input terminal 10 to connect. Specifically, each of the second connection regions 120 is used for one first connection port 11 to connect. The connection main region of the second power main region CE0 may be formed by the first connection region 110. The first connection regions 110 and the second connection regions 120 are arranged alternately in pairs on the second surface SF2 of the second main substrate 40 in a direction parallel to short edges of the first main substrate 30 and the second main substrate 40. The first connection regions 110 and the second connection regions 120 are separated and have a spacing between each other. For example, as shown in FIG. 4, there is a second connection region 120 between every two first connection regions 110, such that the first connection regions 110 and the second connection regions 120 are arranged alternately in pairs. That is, the first connection regions 110 and the second connection regions 120 are arranged alternately one by one. In this way, parasitic inductance of the power module 1 can be reduced.

As shown in FIG. 6, in some embodiments, the first mounting main region MA1 has a plurality of third connection regions 130 for the first connection ports 11 of the first power input terminal 10 to connect. Specifically, each of the third connection regions 130 is used for one first connection port 11 to connect. The fourth power subregion CD2 has a plurality of fourth connection regions 140 for the second connection ports 21 of the second power input terminal 20 to connect. Specifically, each of the fourth connection regions 140 is used for one second connection port 21 to connect. The third connection regions 130 and the fourth connection regions 140 are arranged alternately in pairs on the first surface SF1 of the first main substrate 30 in a direction parallel to short edges of the first main substrate 30 and the second main substrate 40. The third connection regions 130 and the fourth connection regions 140 are separated and have a spacing between each other. For example, as shown in FIG. 6, the two fourth connection regions 140 close to long edges of the first main substrate 30 are between different two third connection regions 130 respectively, and all the other fourth connection regions 140 (that is, the fourth connection regions 140 away from the long edges of the first main substrate 30) are between the same two third connection regions 130. In this way, parasitic inductance of the power module 1 can be reduced.

As shown in FIG. 4 and FIG. 6, in some embodiments, each of the first power input terminal 10 and the second power input terminal 20 includes a connection base. The first connection port 11 of the first power input terminal 10 extends from the connection base of the first power input terminal 10. The second connection port 21 of the second power input terminal 20 extends from the connection base of the second power input terminal 20. The connection bases of the first power input terminal 10 and the second power input terminal 20 may overlap each other.

As shown in FIG. 3 to FIG. 6, in some embodiments, the first main substrate 30 further includes a first control main region CF1 on the first surface SF1. The second main substrate 40 further includes a second control main region CF2 on the second surface SF2. The first control terminal G1 of the first switch 50 is connected to the first control main region CF1. The second control terminal G2 of the second switch 60 is connected to the second control main region CF2. The first control main region CF1 and the second control main region CF2 are connected to the second conducting regions CA2 of the first bridge subunit 71 and the second bridge subunit 72.

For example, as shown in FIG. 3 and FIG. 4, in the first embodiment and the second embodiment, the first control main region CF1 includes two first control subregions on two sides of the first mounting main region MA1 and close to long edges of the first main substrate 30 respectively. The second control main region CF2 includes two second control subregions on two sides of the third power subregions CE2 of the second power main region CE0 and close to long edges of the second main substrate 40. The second conducting region CA2 of each of the first bridge subunit 71 and the second bridge subunit 72 includes two second conducting subregions arranged in a direction parallel to the long edges of the first main substrate 30 and the second main substrate

40. The first control terminal G1 of the first switch 50 is connected to the two first control subregions through a connecting member. The two first control subregions are connected to one of the two second conducting subregions of the second conducting region CA2 of each of two second bridge subunits 72 through connecting members. One of the two second conducting subregions of the second conducting region CA2 of one of the two second bridge subunits 72 is connected to the first drive terminal 93 through a connecting member. One of the two second conducting subregions of the second conducting region CA2 of each of the two second bridge subunits 72 is connected to each other (for example, a tail end of one of the two second conducting subregions of the second conducting region CA2 of one of the two second bridge subunits 72 and a tail end of one of the two second conducting subregions of the second conducting region CA2 of the other of the two second bridge subunits 72 are connected to two ends of one of the two second conducting subregions of the second conducting region CA2 of the first bridge subunit 71 respectively, or one of the two second conducting subregions of the second conducting region CA2 of each of the two second bridge subunits 72 is connected to each other through one of the two second conducting subregions of the second conducting region CA2 of the first bridge subunit 71 and a connecting member). Therefore, the first control terminal G1 of the first switch 50 may obtain the first control signal from the first drive terminal 93.

The second control terminal G2 of the second switch 60 is connected to the two second control subregions through a connecting member. The two second control subregions are connected to the other of the two second conducting subregions of the second conducting region CA2 of each of the two second bridge subunits 72 through connecting members. The other of the two second conducting subregions of the second conducting region CA2 of one of the two second bridge subunits 72 is connected to the second drive terminal 94 through a connecting member. The other of the two second conducting subregions of the second conducting region CA2 of each of the two second bridge subunits 72 is connected to each other (for example, a tail end of the other of the two second conducting subregions of the second conducting region CA2 of one of the two second bridge subunits 72 and a tail end of the other of the two second conducting subregions of the second conducting region CA2 of the other of the two second bridge subunits 72 are connected to two ends of the other of the two second conducting subregions of the second conducting region CA2 of the first bridge subunit 71 respectively, or the other of the two second conducting subregions of the second conducting region CA2 of each of the two second bridge subunits 72 is connected to each other through the other of the two second conducting subregions of the second conducting region CA2 of the first bridge subunit 71 and a connecting member). Therefore, the second control terminal G2 of the second switch 60 may obtain the second control signal from the second drive terminal 94.

As shown in FIG. 5, a difference of the third embodiment from the first embodiment and the second embodiment lies in that the first mounting main region MA1 surrounds the first control main region CF1 in an open loop, and the second mounting main region MA2 surrounds the second control main region CF2. The first control terminal G1 of the first switch 50 is connected to the first control main region CF1 through a connecting member. The first control main region CF1 is connected to the second conducting region CA2 of one of two first bridge subunits 71 through a connecting member. The second conducting region CA2 of one of the two first bridge subunits 71 is connected to the first drive terminal 93 through a connecting member. Therefore, the first control terminal G1 of the first switch 50 may obtain the first control signal from the first drive terminal 93. The second control terminal G2 of the second switch 60 is connected to the second control main region CF2 through a connecting member. The second control main region CF2 is connected to the second conducting region CA2 of the other of the two first bridge subunits 71 through a connecting member. The second conducting region CA2 of the other of the two first bridge subunits 71 is connected to the second conducting region CA2 of the second bridge subunit 72 through a connecting member. The second conducting region CA2 of the second bridge subunit 72 is connected to the second drive terminal 94 through a connecting member. Therefore, the second control terminal G2 of the second switch 60 may obtain the second control signal from the second drive terminal 94.

As shown in FIG. 6, a difference of the fourth embodiment from the first embodiment, the second embodiment, and the third embodiment lies in that the first mounting main region MA1 surrounds the first control main region CF1, and the second mounting main region MA2 surrounds the second control main region CF2. The first control terminal G1 of the first switch 50 is connected to the first control main region CF1 through a connecting member. The first control main region CF1 is connected to the second conducting region CA2 of one of two first bridge subunits 71 through a connecting member. The second conducting region CA2 of one of the two first bridge subunits 71 is connected to the second conducting region CA2 of one of the two second bridge subunits 72 through a connecting member. The second conducting region CA2 of one of the two second bridge subunits 72 is connected to the first drive terminal 93 through a connecting member. Therefore, the first control terminal G1 of the first switch 50 may obtain the first control signal from the first drive terminal 93. The second control terminal G2 of the second switch 60 is connected to the second control main region CF2 through a connecting member. The second control main region CF2 is connected to the second conducting region CA2 of the other of the two first bridge subunits 71 through a connecting member. The second conducting region CA2 of the other of the two first bridge subunits 71 is connected to the second conducting region CA2 of the other of the two bridge subunits 72 through a connecting member. The second conducting region CA2 of the other of the two second bridge subunits 72 is connected to the second drive terminal 94 through a connecting member. Therefore, the second control terminal G2 of the second switch 60 may obtain the second control signal from the second drive terminal 94.

As shown in FIG. 4 and FIG. 5, in some embodiments, a plurality of first resistors are disposed in the first control main region CF1, and a plurality of second resistors are disposed in the second control main region CF2. The first resistors are in one-to-one correspondence to the first switches 50. The second resistors are in one-to-one correspondence to the second switches 60. The first resistors have a same resistance value. The second resistors have a same resistance value. Therefore, in the switch circuit 80 (shown in FIG. 2), one first resistor is connected in series between the first control terminal G1 of each of the first switches 50 and the first drive terminal 93, to ensure that switching speeds of all the first switches 50 are consistent. One second resistor is connected in series between the second control terminal G2 of each of the second switches 60 and the second drive terminal 94, to ensure that switching speeds of all the second switches 60 are consistent.

As shown in FIG. 3 to FIG. 6, in some embodiments, the first main substrate 30 further includes a first detection main region CH1 on the first surface SF1. The second main substrate 40 further includes a second detection main region CH2 on the second surface SF2. The first output terminal S1 of the first switch 50 is connected to the first detection main region CH1. The second output terminal S2 of the second switch 60 is connected to the second detection main region CH2. The first detection main region CH1 and the second detection main region CH2 are connected to the third conducting regions CA3 of the first bridge subunit 71 and the second bridge subunit 72.

For example, as shown in FIG. 3 and FIG. 4, in the first embodiment and the second embodiment, the first detection main region CH1 includes two first detection subregions on two sides of the first mounting main region MA1 and close to long edges of the first main substrate 30 respectively. The second detection main region CH2 includes two second detection subregions on two sides of the third power subregion CE2 of the second power main region CE0 and close to long edges of the second main substrate 40. The third conducting region CA3 of each of the first bridge subunit 71 and the second bridge subunit 72 includes two third conducting subregions arranged in a direction parallel to the long edges of the first main substrate 30 and the second main substrate 40. The first output terminal S1 of the first switch 50 is connected to the two first detection subregions through a connecting member. The two first detection subregions are connected to one of the two third conducting subregions of the third conducting region CA3 of each of two second bridge subunits 72 through connecting members. One of the two third conducting subregions of the third conducting region CA3 of one of the two second bridge subunits 72 is connected to the first detection terminal 95 through a connecting member. One of the two third conducting subregions of the third conducting region CA3 of each of the two second bridge subunits 72 is connected to each other (for example, a tail end of one of the two third conducting subregions of the third conducting region CA3 of one of the two second bridge subunits 72 and a tail end of one of the two third conducting subregions of the third conducting region CA3 of the other of the two second bridge subunits 72 are connected to two ends of one of the two third conducting subregions of the third conducting region CA3 of the first bridge subunit 71 respectively, or one of the two third conducting subregions of the third conducting region CA3 of each of the two second bridge subunits 72 is connected to each other through one of the two third conducting subregions of the third conducting region CA3 of the first bridge subunit 71 and a connecting member). Therefore, the first output signal of the first output terminal S1 of the first switch 50 may be output to the first detection terminal 95.

The second output terminal S2 of the second switch 60 is connected to the two second detection subregions through the connecting member. The two second detection subregions are connected to the other of the two third conducting subregions of the third conducting region CA3 of each of the two second bridge subunits 72 through connecting members. The other of the two third conducting subregions of the third conducting region CA3 of one of the two second bridge subunits 72 is connected to the second detection terminal 96 through a connecting member. The other of the two third conducting subregions of the third conducting region CA3 of each of the two second bridge subunits 72 is connected to each other (for example, a tail end of the other of the two third conducting subregions of the third conducting region CA3 of one of the two second bridge subunits 72 and a tail end of the other of the two third conducting subregions of the third conducting region CA3 of the other of the two second bridge subunits 72 are connected to two ends of the other of the two third conducting subregions of the third conducting region CA3 of the first bridge subunit 71 respectively, or the other of the two third conducting subregions of the third conducting region CA3 of each of the two second bridge subunits 72 is connected to each other through the other of the two third conducting subregions of the third conducting region CA3 of the first bridge subunit 71 and a connecting member). Therefore, the second output signal of the second output terminal S2 of the second switch 60 may be output to the second detection terminal 96.

As shown in FIG. 5, a difference of the third embodiment from the first embodiment and the second embodiment lies in that the first mounting main region MA1 surrounds the first detection main region CH1 in an open loop, and the second mounting main region MA2 surrounds the second detection main region CH2. The first output terminal S1 of the first switch 50 is connected to the first detection main region CH1 through a connecting member. The first detection main region CH1 is connected to the third conducting region CA3 of one of two first bridge subunits 71 through a connecting member. The third conducting region CA3 of one of the two first bridge subunits 71 is connected to the first detection terminal 95 through a connecting member. Therefore, the first output signal of the first output terminal S1 of the first switch 50 may be output to the first detection terminal 95. The second output terminal S2 of the second switch 60 is connected to the second detection main region CH2 through a connecting member. The second detection main region CH2 is connected to the third conducting region CA3 of the other of the two first bridge subunits 71 through a connecting member. The third conducting region CA3 of the other of the two first bridge subunits 71 is connected to the third conducting region CA3 of the second bridge subunit 72 through a connecting member. The third conducting region CA3 of the second bridge subunit 72 is connected to the second detection terminal 96 through a connecting member. Therefore, the second output signal of the second output terminal S2 of the second switch 60 may be output to the second detection terminal 96.

As shown in FIG. 6, a difference of the fourth embodiment from the first embodiment, the second embodiment, and the third embodiment lies in that the first mounting main region MA1 surrounds the first detection main region CH1, and the second mounting main region MA2 surrounds the second detection main region CH2. The first output terminal S1 of the first switch 50 is connected to the first detection main region CH1 through a connecting member. The first detection main region CH1 is connected to the third conducting region CA3 of one of two first bridge subunits 71 through a connecting member. The third conducting region CA3 of one of the two first bridge subunits 71 is connected to the third conducting region CA3 of one of two second bridge subunits 72 through a connecting member. The third conducting region CA3 of one of the two second bridge subunits 72 is connected to the first detection terminal 95 through a connecting member. Therefore, the first output signal of the first output terminal S1 of the first switch 50 may be output to the first detection terminal 95. The second output terminal S2 of the second switch 60 is connected to the second detection main region CH2 through a connecting member. The second detection main region CH2 is connected to the third conducting region CA3 of the other of the two first bridge subunits 71 through a connecting member. The third conducting region CA3 of the other of the two first bridge subunits 71 is connected to the third conducting region CA3 of the other of the two second bridge subunits 72 through a connecting member. The third conducting region CA3 of the other of the two second bridge subunits 72 is connected to the second detection terminal 96 through a connecting member. Therefore, the second output signal of the second output terminal S2 of the second switch 60 may be output to the second detection terminal 96.

As shown in FIG. 3 to FIG. 5, in some embodiments, the power module 1 further includes a thermistor 99 for a measurement apparatus (for example, an ohmmeter) to connect. Therefore, the measurement apparatus obtains a temperature of the power module 1 based on a change of a resistance value of the thermistor 99.

In some embodiments, the connecting member is made from a conductive material. The conductive material may be a metal conductive wire, a metal wire tape, or the like. The metal conductive wire and the metal wire tape may be made from a conductive metal, for example, copper or aluminum.

In summary, according to some embodiments, by using the bridge main unit, the power module can bear a great current signal, and is unlikely to be damaged by impact of a thermal stress. In some embodiments, a current signal of a great current and another type of signal (for example, source signals and gate signals of the first switch and the second switch) may be simultaneously transmitted between the first main substrate and the second main substrate by using the bridge main unit.

What is claimed is:

1. A power module, comprising:
a first power input terminal, comprising a plurality of first connection ports;
a second power input terminal, comprising a plurality of second connection ports;
a first main substrate, comprising a first surface;
a second main substrate, comprising a second surface;
a plurality of first switches, each of the first switches comprising a first control terminal, a first input terminal, and a first output terminal;
a plurality of second switches, each of the second switches comprising a second control terminal, a second input terminal, and a second output terminal; and
a bridge main unit across the first surface and the second surface, wherein the bridge main unit comprises at least one first bridge subunit and at least one second bridge subunit; each of the first bridge subunit and the second bridge subunit comprises a bottom surface, a top surface opposite to the bottom surface, a first conducting region, a second conducting region, and a third conducting region; the bottom surface faces the first surface and the second surface; the first conducting region is on the bottom surface; the second conducting region and the third conducting region are on the top surface;
wherein, the first conducting region of the at least one first bridge subunit is connected between the first output terminals of the first switches and the second input terminals of the second switches; the first conducting region of the at least one second bridge subunit is connected between the first input terminals of the first switches and the first power input terminal or between the second output terminals of the second switches and the second power input terminal, so as to transmit current signals between the first power input terminal, the first switches, the second switches, and the second power input terminal;
wherein, the second conducting regions of the at least one first bridge subunit and the at least one second bridge subunit are connected to the first control terminals of the first switches and the second control terminals of the second switches, so as to transmit control signals of the first switches and the second switches; and
wherein, the third conducting regions of the at least one first bridge subunit and the at least one second bridge subunit are connected to the first output terminals of the first switches and the second output terminals of the second switches, so as to transmit output signals of the first switches and the second switches.

2. The power module according to claim 1, wherein the first connection ports and the second connection ports are arranged alternately in pairs on the first surface of the first main substrate or the second surface of the second main substrate in a direction parallel to short edges of the first main substrate and the second main substrate.

3. The power module according to claim 1, wherein the at least one first bridge subunit and the at least one second bridge subunit are arranged in a direction parallel to short edges of the first main substrate and the second main substrate.

4. The power module according to claim 1, wherein the first main substrate further comprises a first mounting main region on the first surface, the second main substrate further comprises a second mounting main region on the second surface, the first input terminals of the first switches are connected to the first mounting main region, and the second input terminals of the second switches are connected to the second mounting main region.

5. The power module according to claim 4, wherein the first main substrate further comprises a first power main region on the first surface, the first power main region comprises at least one first power subregion connected to the first output terminals of the first switches, and two sides of the first conducting region of the at least one first bridge subunit are connected to the at least one first power subregion and the second mounting main region respectively.

6. The power module according to claim 5, wherein the at least one first power subregion is close to the first mounting main region.

7. The power module according to claim 5, the power module further comprises two power output terminals, wherein when the first conducting region of the at least one second bridge subunit is connected between the first input terminals of the first switches and the first power input terminal, the two power output terminals are connected to the at least one first power subregion of the first power main region.

8. The power module according to claim 5, wherein the second main substrate further comprises a second power main region on the second surface, and the second power main region comprises at least one second power subregion connected to the second output terminals of the second switches and the second power input terminal.

9. The power module according to claim 8, wherein the at least one second power subregion is close to the second mounting main region.

10. The power module according to claim 8, wherein when the first conducting region of the at least one second bridge subunit is connected between the first input terminals of the first switches and the first power input terminal, the second power main region comprises at least one third power subregion connected to the first connection ports of the first power input terminal, and two sides of the first conducting region of the at least one second bridge subunit are connected to the first mounting main region and the at least one third power subregion respectively.

11. The power module according to claim 10, wherein the at least one third power subregion surrounds the second mounting main region and the at least one second power subregion, so as to form an open loop with a notch, and the bridge main unit is close to the notch.

12. The power module according to claim 10, wherein the at least one second power subregion has a plurality of first connection regions for the second connection ports of the second power input terminal to connect, the at least one third power subregion has a plurality of second connection regions for the first connection ports of the first power input terminal to connect, and the first connection regions and the second connection regions are arranged alternately in pairs on the second surface of the second main substrate in a direction parallel to short edges of the first main substrate and the second main substrate.

13. The power module according to claim 8, wherein when the first conducting region of the at least one second bridge subunit is connected between the second output terminals of the second switches and the second power input terminal, the at least one second power subregion of the second power main region is connected to the second output terminals of the second switches, the first power main region comprises at least one fourth power subregion connected to the second connection ports of the second power input terminal, and two sides of the first conducting region of the at least one second bridge subunit are connected to the at least one second power subregion and the at least one fourth power subregion respectively.

14. The power module according to claim 13, wherein the at least one fourth power subregion is close to the at least one first power subregion.

15. The power module according to claim 13, wherein the first mounting main region has a plurality of third connection regions for the first connection ports of the first power input terminal to connect, the at least one fourth power subregion has a plurality of fourth connection regions for the second connection ports of the second power input terminal to connect, and the third connection regions and the fourth connection regions are arranged alternately in pairs on the first surface of the first main substrate in a direction parallel to short edges of the first main substrate and the second main substrate.

16. The power module according to claim 8, further comprising two power output terminals, wherein when the first conducting region of the at least one second bridge subunit is connected between the second input terminals of the second switches and the second power input terminal, the two power output terminals are connected to the second mounting main region.

17. The power module according to claim 16, wherein the second power main region comprises at least one fifth power subregion, the two power output terminals are connected to the at least one fifth power subregion, and the at least one fifth power subregion is connected to the second mounting main region.

18. The power module according to claim 17, wherein at least one fifth power subregion is close to the at least one second power subregion.

19. The power module according to claim 1, wherein the first main substrate further comprises a first control main region on the first surface, the second main substrate further comprises a second control main region on the second surface, the first control terminals of the first switches are connected to the first control main region, the second control terminals of the second switches are connected to the second control main region, and the first control main region and the second control main region are connected to the second conducting regions of the at least one first bridge subunit and the at least one second bridge subunit.

20. The power module according to claim 1, wherein the first main substrate further comprises a first detection main region on the first surface, the second main substrate further comprises a second detection main region on the second surface, the first output terminals of the first switches are connected to the first detection main region, the second output terminals of the second switches are connected to the second detection main region, and the first detection main region and the second detection main region are connected to the third conducting regions of the at least one first bridge subunit and the at least one second bridge subunit.

* * * * *